US008750525B2

(12) United States Patent
Martz et al.

(10) Patent No.: US 8,750,525 B2
(45) Date of Patent: Jun. 10, 2014

(54) METHOD TO MAXIMIZE LOUDSPEAKER SOUND PRESSURE LEVEL WITH A HIGH PEAK TO AVERAGE POWER RATIO AUDIO SOURCE

(75) Inventors: Donald Martz, Webster, NY (US); Bryce Tennant, Rochester, NY (US); Anthony Richard Alan Keane, Webster, NY (US)

(73) Assignee: Harris Corporation, Melbourne, FL (US)

( * ) Notice: Subject to any disclaimer, the term of this patent is extended or adjusted under 35 U.S.C. 154(b) by 479 days.

(21) Appl. No.: 12/695,371

(22) Filed: Jan. 28, 2010

(65) Prior Publication Data

US 2011/0182434 A1 Jul. 28, 2011

(51) Int. Cl.
*H03G 11/00* (2006.01)

(52) U.S. Cl.
USPC ................... 381/55; 381/56; 381/57; 381/58; 381/59; 381/98; 381/96; 381/397; 381/111; 381/94.1; 330/254; 330/297; 700/94

(58) Field of Classification Search
USPC ................ 381/55–59, 98, 96, 397, 111, 94.1; 330/254, 297; 700/94
See application file for complete search history.

(56) References Cited

U.S. PATENT DOCUMENTS

| | | | | |
|---|---|---|---|---|
| 4,054,845 | A | | 10/1977 | Glogolja et al. |
| 4,093,822 | A | | 6/1978 | Steinle |
| 4,215,575 | A | * | 8/1980 | Akita et al. ................... 374/119 |
| 4,327,250 | A | | 4/1982 | Von Recklinghausen |
| 4,583,245 | A | | 4/1986 | Gelow et al. |
| 4,742,312 | A | | 5/1988 | Osburn et al. |
| 4,864,624 | A | | 9/1989 | Tichy |
| 4,939,786 | A | * | 7/1990 | McCallum et al. ......... 455/67.11 |
| 4,944,020 | A | | 7/1990 | Noro |
| 5,249,141 | A | | 9/1993 | Vandebroek et al. |
| 5,515,432 | A | | 5/1996 | Rasmusson |
| 5,528,695 | A | * | 6/1996 | Klippel ........................... 381/55 |
| 5,600,575 | A | * | 2/1997 | Anticole ....................... 702/132 |

(Continued)

FOREIGN PATENT DOCUMENTS

| | | |
|---|---|---|
| DE | 43 36 609 A1 | 5/1995 |
| GB | 2 187 607 A | 9/1987 |
| WO | 02 21879 A2 | 3/2002 |

OTHER PUBLICATIONS

Fabio Blasizzo, A New Thermal Model for Loudspeaker, AES ,2003.*

(Continued)

*Primary Examiner* — Davetta W Goins
*Assistant Examiner* — Kuassi Ganmavo
(74) *Attorney, Agent, or Firm* — Fox Rothschild, LLP; Robert J. Sacco

(57) ABSTRACT

A system is provided to protect a loudspeaker (144) by controlling a level of an applied audio signal. A control signal is generated by applying an input audio signal (115) to the collective operations of a gain control system (100). The gain control system (100) uses the input audio signal (115) in conjunction with at least one parameter to derive an estimated stress associated with the loudspeaker (144). The estimated stress is compared with a protection threshold stress (127). If the protection threshold stress is exceeded, a gain applied by a gain component (134) is selectively adjusted to modify the input audio signal (115). The resulting gain-controlled audio signal (116) is employed to drive the loudspeaker (144).

29 Claims, 3 Drawing Sheets

(56) References Cited

U.S. PATENT DOCUMENTS

| | | | | |
|---|---|---|---|---|
| 5,729,611 | A * | 3/1998 | Bonneville | 381/55 |
| 5,774,784 | A * | 6/1998 | Ohno | 455/343.2 |
| 6,584,204 | B1 * | 6/2003 | Al-Ali et al. | 381/96 |
| 6,647,120 | B2 | 11/2003 | Howze | |
| 7,356,102 | B2 * | 4/2008 | Morton et al. | 375/345 |
| 7,372,966 | B2 | 5/2008 | Bright | |
| 7,436,967 | B2 * | 10/2008 | Neunaber | 381/55 |
| 7,447,318 | B2 * | 11/2008 | Button et al. | 381/55 |
| 7,840,015 | B1 * | 11/2010 | Melanson et al. | 381/107 |
| 8,023,668 | B2 * | 9/2011 | Pfaffinger | 381/164 |
| 2002/0126432 | A1 | 9/2002 | Goldenberg et al. | |
| 2005/0018856 | A1 * | 1/2005 | Kim et al. | 381/57 |
| 2005/0147263 | A1 | 7/2005 | Shimamura | |
| 2005/0244014 | A1 * | 11/2005 | Elko et al. | 381/58 |
| 2007/0160221 | A1 * | 7/2007 | Pfaffinger | 381/59 |
| 2007/0239290 | A1 * | 10/2007 | Nussbaum et al. | 700/77 |
| 2008/0175397 | A1 * | 7/2008 | Holman | 381/55 |
| 2009/0215439 | A1 * | 8/2009 | Hamilton et al. | 455/418 |
| 2009/0257599 | A1 * | 10/2009 | Sand Jensen et al. | 381/55 |
| 2011/0194705 | A1 * | 8/2011 | Gautama | 381/59 |

OTHER PUBLICATIONS

Wolfgang Klippel, Non Linear Modeling of the heat transfer in Loudspeakers, AES,2004.*

European Search Report mailed May 31, 2013, in Application Serial No. EPA-113 597 in the name of Harris Corporation.

* cited by examiner

METHOD TO MAXIMIZE LOUDSPEAKER SOUND PRESSURE LEVEL WITH A HIGH PEAK TO AVERAGE POWER RATIO AUDIO SOURCE

BACKGROUND OF THE INVENTION

1. Statement of the Technical Field

The invention is directed to a loudspeaker system. In particular, the invention is directed to a system which protects a loudspeaker while maximizing the power that can be input to the loudspeaker.

2. Description of the Related Art

Sound reproduced by a portable handheld radio transceiver system is required to be loud enough to remain intelligible among environmental noises. For a small loudspeaker within a portable handheld radio transceiver system, this loudness may be achieved by driving the loudspeaker near its operational limits. However, driving a loudspeaker near its operational limits incurs a risk of overdriving the loudspeaker.

Overdriving a loudspeaker may disrupt the reproduction of an output sound in various manners. For example, overdriving a loudspeaker may cause elements of the loudspeaker to overheat, resulting in permanent damage or failure of the loudspeaker. Overdriving a loudspeaker may also risk distortion of the output sound, resulting in an abrupt and unpleasant attenuation of the output sound. The risk of overdriving a loudspeaker may be further complicated by environmental conditions, such as ambient temperature extremes in the environment of use. Such environmental conditions can cause a loudspeaker associated with a portable radio system to reach its operational limits at comparatively lower drive levels.

Simple protection schemes have been devised to address aspects of this risk. Yet, these schemes remain deficient in providing a proper degree of protection. For example, simple schemes involving feedback of an audio signal may not be able to prevent loudspeaker damage under unusual signal conditions, including when a protection scheme is unable to quickly respond. Moreover, simple protection schemes that rely on the level of an applied audio signal may not adequately account for one or more other time varying factors associated with a loudspeaker, such as a temperature, a period of time over which the audio signal is applied, and a waveform shape of the audio signal. These simple protection schemes may also reduce the loudness of the output sound unnecessarily. That is, simple protection schemes may overprotect a loudspeaker at the expense of an otherwise preferable and achievable output sound pressure level.

SUMMARY OF THE INVENTION

The invention concerns a loudspeaker system. The system generally includes a loudspeaker and a stress component arranged to determine from an audio signal a stress value. The stress value represents an estimate of the stress imposed on the loudspeaker by the audio signal. A control component is also provided. The control component is arranged to provide a gain value based on the stress value. A gain component provides a gain controlled audio signal for the loudspeaker by selectively controlling a gain applied to an input signal of the loudspeaker based on the gain value.

In some embodiments, the audio signal used to determine the stress value is an input audio signal applied to the loudspeaker system. In other embodiments, the audio signal used for this purpose is instead generated by a microphone which monitors an output of the loudspeaker. In other embodiments, the system can use both of these audio signals.

The stress component is advantageously configured to determine the stress value using a time constant associated with the loudspeaker. In effect, the time constant is used to model certain characteristics of the loudspeaker. For example, the stress component in some embodiments is configured to determine the stress value by modeling the thermal response of the loudspeaker. In other embodiments, the stress component is configured to estimate a cumulative mechanical stress resulting from vibration on the loudspeaker over a predetermined period of time. In still further embodiments the stress component can be a simple electronic circuit that limits a maximum amount of energy that can be delivered to the loudspeaker over some predetermined period of time. For example, the maximum amount of energy can be based on a manufacturer's specification for the maximum power handling capability of the loudspeaker.

The stress component can be arranged to evaluate any parameter that stresses the operation of the loudspeaker. For example, such stresses can involve mechanical, electrical, electro-mechanical, acoustic, or temperature stress, without limitation. For example, in some embodiments of the invention, the stress component is implemented more particularly as a temperature component. The temperature component, the control component, and the gain component work together to provide a gain controlled audio signal for the loudspeaker. The gain of this audio signal is selectively controlled by these components in order to protect the loudspeaker from being overdriven.

To determine an appropriate amount of protection, an input audio signal is monitored by the temperature component to derive an estimated temperature. This estimated temperature is based on the input audio signal, as well as at least one parameter associated with the loudspeaker. One parameter associated with the loudspeaker is a thermal time constant. The thermal time constant represents operating conditions associated with the loudspeaker. Particularly, the thermal time constant models a temperature change of a coil of the loudspeaker when an amount of power is applied over time. When combined with the input audio signal, the thermal time constant is used by the temperature component to determine the estimated temperature.

The determination of the estimated temperature may also account for other parameters associated with the loudspeaker. For example, a temperature sensor may be optionally included in the loudspeaker system. This temperature sensor may provide a value associated with an external ambient temperature in which the loudspeaker system is being used. The temperature component measures the external ambient temperature value and employs this value to adjust an estimated temperature calculated from the input audio signal and a thermal time constant. If a temperature sensor is not included in the loudspeaker system, the estimated temperature may be adjusted based on a maximum rated operating temperature of the loudspeaker system.

The estimated temperature, once derived, is compared with a threshold temperature at which protection is actively provided for the loudspeaker. This protection is actively provided by controlling a level of gain applied to the input audio signal. If the estimated temperature associated with the loudspeaker exceeds the protection threshold temperature, a gain factor provided by the control component to the gain component is variably decreased.

Aspects of the present invention also include at least an apparatus and method for maximizing a sound pressure level of a loudspeaker while preventing damage or distortion thereto.

DESCRIPTION OF THE DRAWINGS

Embodiments will be described with reference to the following drawing figures, in which like numerals represent like items throughout the figures, and in which.

DETAILED DESCRIPTION

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
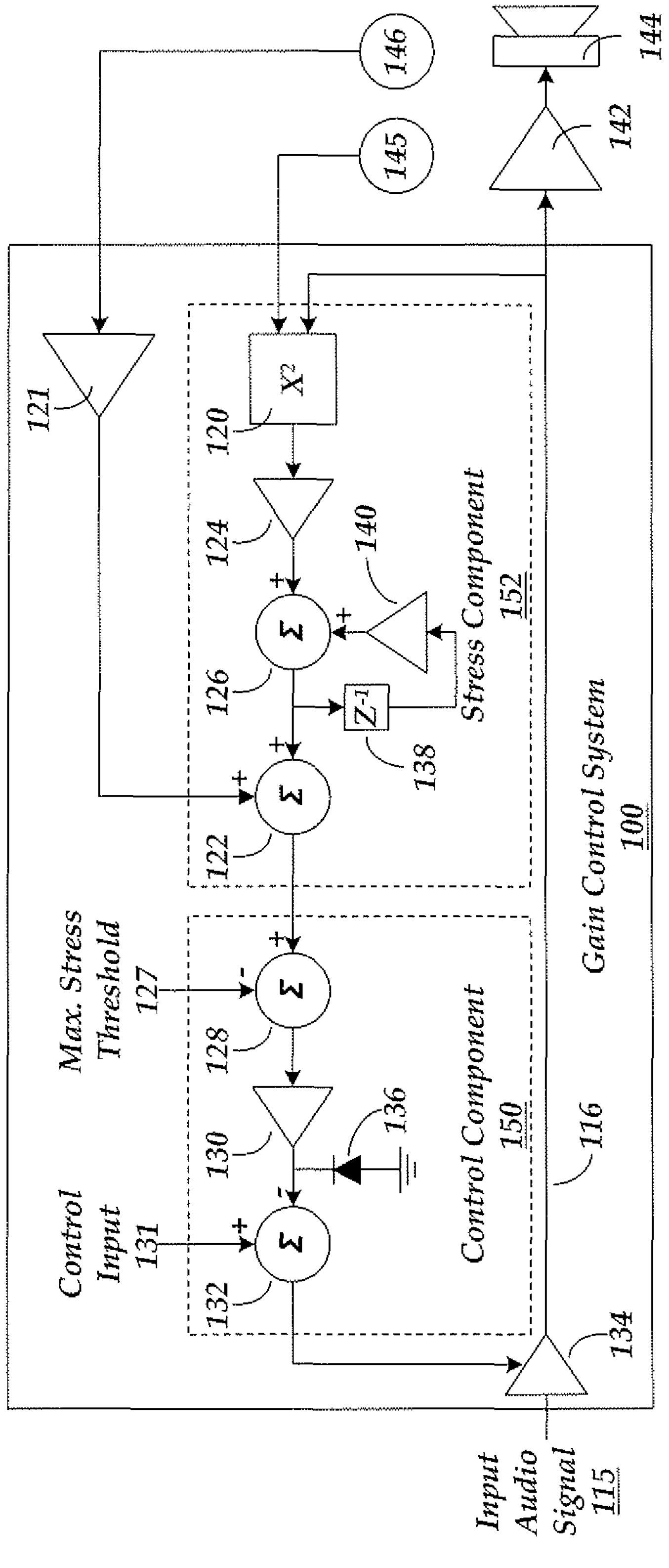
FIG. 1 is a diagram that is useful for understanding a loudspeaker system that can be used to implement again control system.

A high level block diagram of a gain control system 100 is shown in FIG. 1. The gain control system 100 protects an output transducer. For purposes of describing the present invention, the output transducer shall be understood to be a conventional audio output transducer which is commonly referred to as a loudspeaker. However, the invention is not limited in this regard. Instead, the inventive arrangements described herein can be applied to any output transducer device which is susceptible to damage from various sources of stress. A common stress encountered by loudspeakers is thermal stress. Accordingly, it is convenient to describe the invention in that context. However, it should be understood that the invention is not limited regarding the particular type of stress against which the system may be used to protect the loudspeaker. Other factors that may stress the loudspeaker include mechanical, electrical, electro-mechanical, acoustic, or temperature stress, without limitation.

The gain control system 100 forms part of a loudspeaker system that is intended to protect a loudspeaker 144. The protection is provided in a manner that enables a maximum sound pressure level to be reproduced without risk of damaging the loudspeaker. Generally, the protection provided by the gain control system 100 is based on estimating or predicting operating conditions of the loudspeaker 144. In the preferred embodiment, the estimated operating conditions at least include a temperature associated with the loudspeaker 144. More particularly, the estimated operating condition can be a temperature of a coil as is commonly used within the loudspeaker for reproduction of sound. Notably, the steady state temperature of the loudspeaker will be proportional to the steady state input power of the audio signal that is applied to the loudspeaker.

As shown in FIG. 1, the operations of gain control system 100 are generally based on a control loop that controls processing of a received input audio signal 115. The input audio signal 115 is provided to gain control system 100 for subsequent output by loudspeaker 144. The input audio signal 115 is received by an input audio circuit, such as amplifier 134. Amplifier 134 is a gain component that can selectively vary an amount of gain applied to input audio signal 115.

The processing of the input audio signal 115 by the gain control system 100 generally comprises assessing an amount of power in the audio input signal 115 and determining its effect on the temperature of the loudspeaker. Protection of the loudspeaker is achieved by adjusting an amount of gain applied to the input audio signal 115 accordingly. Preferably, this processing is performed in real-time, enabling an operating temperature associated with the loudspeaker to be predicted and a potentially damaging audio signal to be attenuated prior to its application to the loudspeaker.

The operation of the control loop in FIG. 1 will now be discussed in further detail. Amplifier 134 produces an amplified version of input audio signal 115, which shall be referred to herein as gain controlled audio signal 116. Gain controlled audio signal 116 is communicated to the control loop, which begins with stress component 152. Stress component 152 includes a first squaring component 120. First squaring component 120 receives the gain controlled audio signal 116 from amplifier 134 and produces an output. The resulting output waveform is the square of the instantaneous signal of the amplified input audio signal and, as such, is related by some value to the power associated with input audio signal 115. Squaring the gain controlled audio signal 116 produces a signal which is linearly proportional to the heat input to the loudspeaker, and advantageously avoids the need to subsequently handle positive and negative waveform values. Still, it should be understood that the invention is not limited in this regard, and alternative methods can be used to calculate a representation of loudspeaker heat input.

The output of the first squaring component 120 is communicated to a thermal model, which is comprised of amplifier 124, summer 126, unit time delay 138, and amplifier 140. The thermal model is designed to generate an output signal that is proportional to the instantaneous temperature of the loudspeaker coil used in loudspeaker 144. Although the thermal model description is essentially a DSP implementation, this could equally well be implemented with a simple CR analog filter.

In stress component 152, the output of the thermal model is summed with a value determined by temperature sensor 146. In the particular embodiment used to describe the invention, the stress component can also be referred to as a temperature component because the particular stress that is being evaluated is related to temperature. However, the invention is not limited in this regard and for this reason this block is more generally referred to throughout the specification as a "stress component".

The temperature sensor 146 generates a value which is proportional to temperature. This value is communicated to a multiplier component 121 so that it can be properly scaled prior to being summed in summer 122 at the output of the thermal model. The temperature sensor 146 is advantageously arranged to sense an ambient temperature. As used herein, ambient temperature generally refers to an environment temperature in which the loudspeaker 144 is operated. For example, the temperature sensor 146 can sense a temperature of a chassis within which the loudspeaker 144 is mounted, although the invention is not limited in this regard. The output of the thermal model is a signal representing the relative temperature of the coil in loudspeaker 144 based on the input audio signal. When the thermal model output is summed with the scaled value from the thermal sensor 146, the output of the stress component 152 represents the absolute temperature of the loudspeaker coil.

In an alternate embodiment, a temperature sensor 146 is not provided. In such a scenario, the input to the multiplier 121 can be a constant value that is determined based on a maximum rated operating temperature of a system in which the gain control system 100 is implemented. This maximum rated operating temperature may be empirically determined and may correspond, for example, to an operational limit of one or more system components. In this alternate embodiment, the maximum rated operating temperature may be predetermined and stored in a memory for use with gain control system 100. The maximum rated operating temperature may then be used to establish an input value applied to the multiplier 121 and the output of multiplier 121 may then be processed as hereinafter described. Any other suitable arrangement can similarly be used to establish this constant input value. It will be appreciated that in any such an implementation, the multiplier component 121 need not be included since an appropriate constant can be applied to summer 122 which is the aforementioned constant multiplied by the scale factor used by the multiplier component 121.

Loudspeaker 144 will have some thermal time constant $\tau$ that can be determined experimentally, by computer simulation, or by any other suitable means. The term time constant refers to the rise-time characterizing the response of a first-order, linear time-invariant (LTI) system to a time-varying input. It is well known that such systems can be modeled by a single first order differential equation in time. Generally, the time constant for such systems is defined in physics as the time required for a physical quantity to rise from zero to 63.2% of its final steady state value when it varies with time t in accordance with the function $1-e^{-kt}$. For example, it is known in the art that electrical RC circuits and RL circuits will have characteristic time constants. Similarly, the loudspeaker 144 will have a thermal time constant. In this regard, it will be appreciated that the thermal time constant of the loudspeaker 144 can be modeled using an RC circuit, an RL circuit, or a digital simulation of such a circuit. In FIG. 1, the thermal time constant of the loudspeaker 144 is modeled using a digital signal processing technique that is well known in the art. However, the invention is not limited in this regard.

It will be appreciated that the thermal time constant of the loudspeaker 144 may not, in some circumstances, be adequately characterized by a simple first-order, linear time-invariant (LTI) system. In such applications, the first order modeling system described herein can be replaced with a higher order realization so as to cover more complex systems having several layers of time constant. For example, there will be secondary time constants in a loudspeaker associated with the thermal mass of the magnet assembly and the loudspeaker frame. In many instances these secondary time constants are unlikely to be important to the system design. However, it is possible that they could potentially be relevant in certain applications, such as in the case of very large loudspeakers.

Referring once again to FIG. 1, the thermal model will now be described in further detail. It can be observed that with each iteration, the thermal model sums the current instantaneous power value with the previous output of the summer 126. Gain is applied before and after by amplifiers 124, 140. The gain of amplifiers 124, 140 and the unit time delay 138 is selected so that the value output from the summer 126 in response to an input audio signal 116 will be proportional to the temperature of loudspeaker 144 in response to the same input audio signal.

In the thermal model, the gain of amplifier 140 is generally selected so that it is much larger than the gain of amplifier 124. The ratio of these gains influences the time constant in that a larger ratio causes a larger time constant. For example, with a sampling rate of 8,000 samples per second, a gain ratio of 100,000 could typically be expected to model a loudspeaker thermal time constant. If the sum of amplifier 124 gain and amplifier 140 gain is made to be unity the overall gain of the thermal model will be unity. Of course, the invention is not limited in this regard. Instead, it should be understood that the gain of the amplifiers 124, 140 and the time delay value associated with time delay 138 will be selected based on the loudspeaker 144 that is being modeled. In general, the time constant of the thermal model should be selected so that it generally matches the time constant of the loudspeaker 144.

The output of the thermal model will be a value that is proportional to the temperature of loudspeaker 144. In this regard, the output of summer 126 is a temperature estimate signal representing an estimated relative temperature of loudspeaker 144. This temperature estimate signal is summed with the scaled thermal sensor signal coming from amplifier 121 and communicated to control component 150, which uses the absolute temperature estimate signal to determine a gain control signal applied to amplifier 134.

The output of summer 122 is communicated to summer 128 in control component 150. In summer 128, a value representing a maximum temperature value is subtracted from the temperature estimate signal provided by summer 122. The maximum temperature value is referred to herein as the maximum stress threshold because it defines the maximum stress level that the speaker should be subjected to with regard to temperature. Accordingly, with reference to FIG. 1, maximum stress threshold 127 is a value that defines the maximum desired operating temperature for loudspeaker 144. The output of summer 128 will be negative when the temperature estimate signal from summer 122 is less than the maximum stress threshold 127. However the output of summer 128 will transition to a positive value whenever the temperature estimate signal exceeds the maximum stress threshold 127.

The output of summer 128 is communicated to amplifier 130 and then communicated to summer 132. Limiter 136 will limit the output of amplifier 130 at a value close to zero when the output of amplifier 130 is attempting to be negative (maximum stress threshold 127 not exceeded). For example, a diode can be used for this purpose, or in a DSP implementation negative numbers are simply forced to zero. With the output of amplifier 130 limited in this way, it will have minimal effect on the output of summer 132. Consequently, the output of summer 132 will generally track the value of normal gain volume at control input 131. However, when the output of amplifier 130 is positive (maximum stress threshold 127 exceeded), the output of summer 132 will be automatically reduced in an amount determined by the gain of amplifier 130.

The output of summer 132 is a gain control signal used to selectively control the gain provided by amplifier 134. Control input 131 is a control signal that is usually a constant selected to create a normal gain which could be, but is not limited to unity. A user adjusts the loudspeaker volume with a gain control situated prior to the audio input signal 115. Such user selection can be achieved by conventional means as will be well known to one of ordinary skill in the art. For example, a volume control knob can be used for this purpose. When the maximum stress threshold 127 is exceeded, the gain control signal output by summer 132 will be substantially influenced by the output of amplifier 130. Amplifier 130 serves to maintain the loudspeaker coil at about its maximum operating temperature. The corrective action of the control loop is made more or less aggressive respectively by increasing or decreasing the gain of amplifier 130. Since it is not necessary to provide very aggressive control in this application, the gain of amplifier 130 can be advantageously selected to provide sufficient protection and control loop stability.

An audio power amplifier 142 can be provided at the output of the gain control system 100. The audio power amplifier can be used to increase the power of the gain controlled audio signal 116 to an output power level suitable for the loudspeaker 144.

In the gain control system described herein, it will now be understood that a first parameter associated with loudspeaker 144 is a thermal time constant. A second parameter associated with the loudspeaker is a base or ambient operating temperature of the loudspeaker system 100. The base operating temperature is the resting or starting temperature of loudspeaker 144, independent of the heating effect caused by the application of the input audio signal. In the stress component 152, usage of the base operating temperature is implemented through operations of summer 122.

In an alternative embodiment of the invention, a microphone 145 is optionally provided. The microphone 145 monitors an output audio signal of loudspeaker 144 and communicates the detected audio signal to first squaring component 120 provided in stress component 152. In this arrangement, the stress component 152 evaluates the stress imposed on loudspeaker 144 based on the monitored output of the loudspeaker provided by microphone 145. The stress component 152 can use the signal from microphone 145 exclusively, i.e. in place of the gain controlled audio signal 116. Alternatively, the stress component can use a combination, such as an average, of these two signals.

Figure 2:
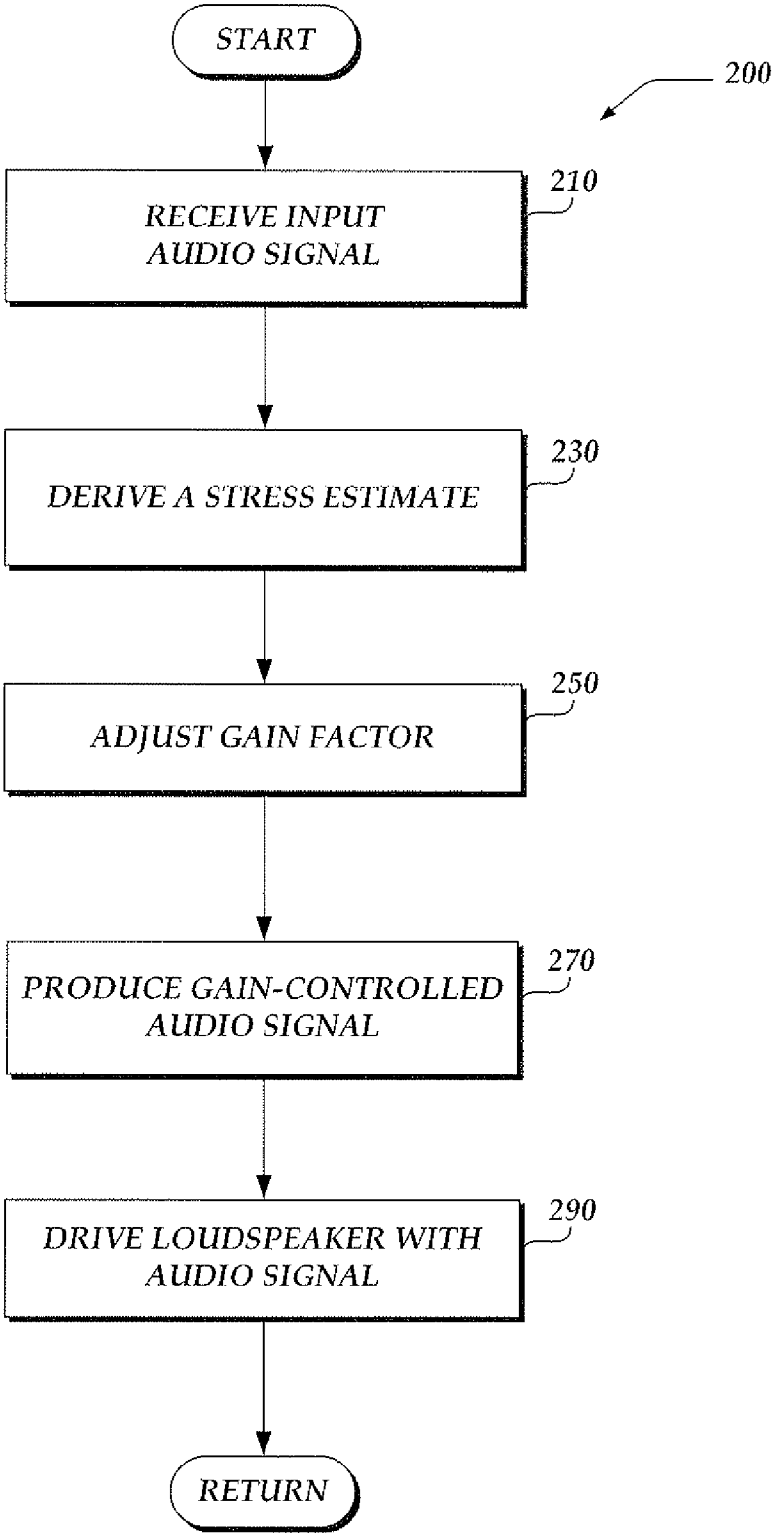
FIG. 2 is an high level diagram of a gain control system that is useful for understanding the invention.

The operation of certain aspects of the invention will now be described with respect to FIG. 2. FIG. 2 illustrates a logical flow diagram generally showing one embodiment of an overview process 300 for maximizing a sound pressure produced by a loudspeaker while also protecting the loudspeaker from damage.

Overall, the operations of FIG. 2 generally represent functionality of a gain control system, such as, for example, gain control system 100 shown in FIG. 1. While the steps in FIG. 2 are shown in order, it is understood that, based on their application to an input audio signal that may vary with time, these steps may be performed in parallel, including with respect to same or different portion of the input audio signal. Moreover, as further suggested above, formal implementation of process 200 may involve the use of analog and/or digital signals. Further, it will be appreciated that the control loop shown in FIG. 1 can be at least partially implemented by a computer processor programmed with a suitable set of instructions, or a logic circuit encoded in logic chips or a device such as an FPGA As shown in FIG. 2, process 200 begins, after a start block, at processing block 210, where an input audio signal is received. The input audio signal, representing an electrical waveform, may be received from a variety of audio input circuits. A common property for each such signal, regardless of the source, is that the audio signal is an input signal provided for subsequent reproduction by a loudspeaker.

At block 230, an estimated temperature is derived. In the preferred embodiment, the estimated temperature derived at block 230 is estimated for a coil of the loudspeaker. The estimated temperature may be derived based on the input audio signal and at least one parameter associated with the loudspeaker. The at least one parameter associated with the loudspeaker comprises at least one thermal time constant associated with the loudspeaker. In addition, the input parameter can include a base operating temperature value associated with the loudspeaker. The estimated temperature corresponds to a predicted instantaneous temperature associated with the loudspeaker based on an input audio signal which has been received. The operations performed at block 230 generally correspond to the processing performed by the stress component 152 shown in FIG. 1 as described in further detail above. Upon deriving an estimated temperature at block 230, process 200 proceeds to block 250.

At block 250, a gain factor is generated based on the estimated temperature associated with the loudspeaker. The operations of block 250 generally correspond to the functions performed by control component 150 shown in FIG. 1. In the preferred embodiment, adjusting the gain factor is at least based on a comparison between the estimated temperature and a maximum temperature (maximum stress threshold 127). If the estimated temperature exceeds the maximum stress threshold, then a gain factor is produced accordingly in order to decrease a gain to the input audio signal via a gain control signal. If the maximum stress threshold is not exceeded, then the gain factor provided in the gain control signal is set to unity. The operations performed at block 250 generally correspond to the processing performed by the control component 150 shown in FIG. 1 and are described in further detail above. Upon adjusting the gain factor based on the estimated temperature at block 250, process 200 proceeds to block 270.

At block 270, a gain-controlled audio signal 116 is produced. In the preferred embodiment, this gain-controlled audio signal is produced by applying the gain factor adjusted in block 250 to the input audio signal 115. Depending on a value of the gain factor, an amount of amplification applied at block 270 may vary so as to decrease a gain applied to the input audio signal 115. The operations performed at block 270 generally correspond to the processing performed by the amplifier 134 shown in FIG. 1 and are described in further detail above.

At block 290, the gain-controlled audio signal 116 is employed to drive the loudspeaker 144. In the preferred embodiment, driving the loudspeaker 144 comprises applying the gain-controlled audio signal 116 to an amplifier 142, which is in turn coupled to a coil of the loudspeaker 144. In an alternate embodiment, the gain-controlled audio signal 116 may be communicated directly to the loudspeaker 144.

Figure 3:
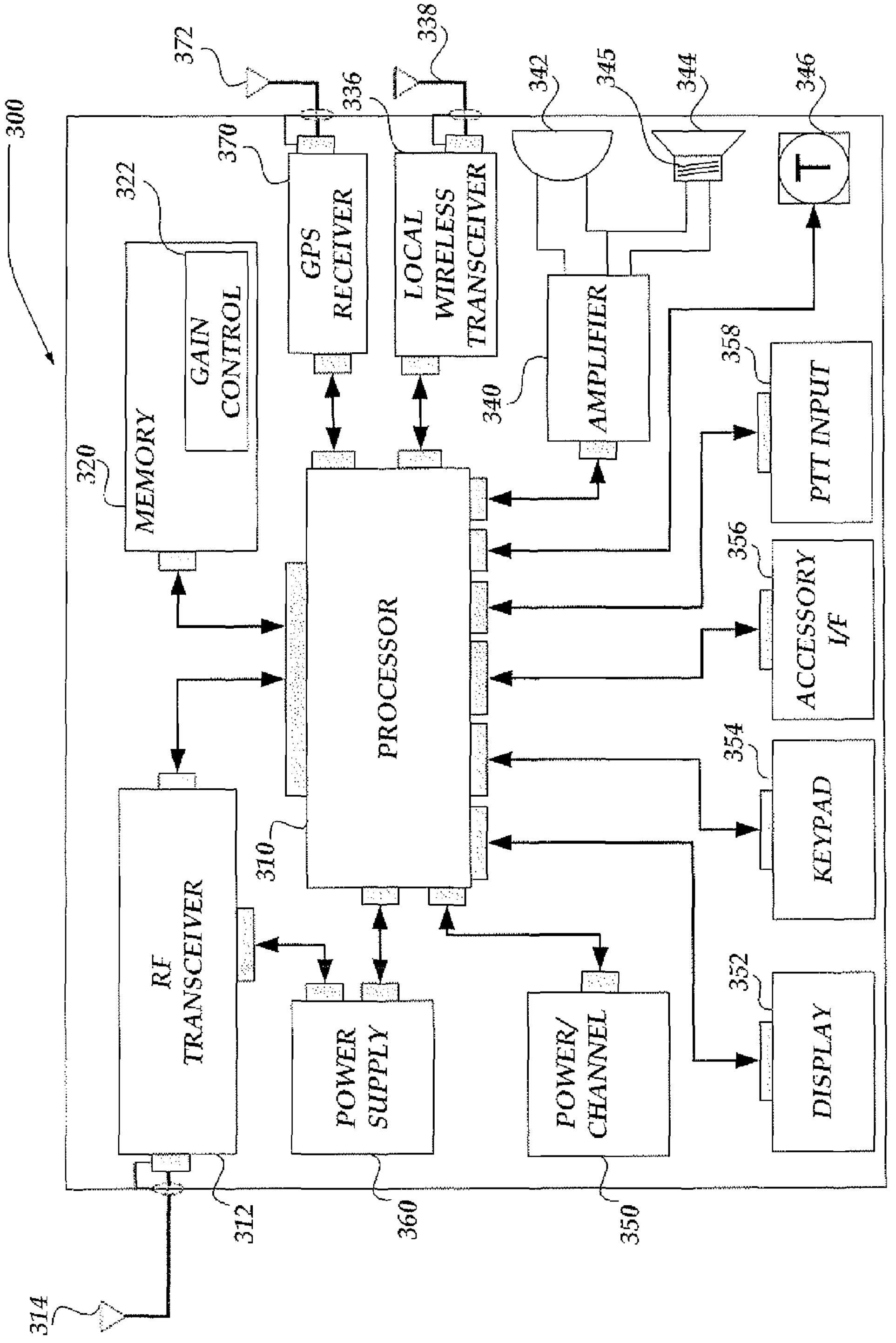
FIG. 3 is a flow diagram generally showing a gain control process which is useful for understanding the invention.

FIG. 3 shows how the volume control system 100 described in FIGS. 1 and 2 may be incorporated in a loudspeaker system implementing the invention. In the embodiment shown, the loudspeaker system is implemented as a portable wireless transceiver 300, such as a Land Mobile Radio (LMR). However, the invention is not limited in this regard. Instead, the volume control system can be implemented in any device where it is desirable to maximize loudspeaker sound pressure while protecting the loudspeaker from damage. Transceiver 300 may include many more or less components than those shown in FIG. 3. However, the components shown are sufficient to disclose an illustrative embodiment for practicing the present invention.

As shown in FIG. 3, transceiver 300 includes a processor 310 in communication with a memory 320. Transceiver 300 also includes a power supply 360, a radio frequency (RF) transceiver 312, an RF antenna 314, a local wireless transceiver 336, a local wireless transceiver antenna 338, an amplifier 340, a microphone 342, a loudspeaker 344, a temperature sensor 346, power and channel control 350, a display 352, a keypad 354, an accessory input/output interface (IF) 356, a push-to-talk (PTT) input 358, a global positioning systems (GPS) receiver 370, and a GPS antenna 372.

Through the use of RF transceiver 312 and associated RF antenna 314, audio signals and other information, such as digital data, may be transmitted and received between a transceiver 300 and a base station or another transceiver 300. The RF transceiver 312 may operate in a single frequency band, or alternatively may operate in a plurality of frequency bands. For example, the RF transceiver 312 may be configured to support analog Frequency Modulation (FM) communications and P25 modulation (digital C4FM) communications in the following bands: 30-50 MHz Very High Frequency (VHF) LOw (LO) band; 136-174 MHz VHF High (Hi) band; 380-520 MHz Ultra High Frequency (UHF) band; and 762-870 MHz band. The transceiver 300 may also operate in other frequency bands and with other modulation schemes. The details of these technologies and the hardware required to implement transmitters and receivers that use these technologies are well known to persons skilled in the art, and thus, will not be described in great detail herein.

Transceiver 300 may be configured to employ RF transceiver 312 and RF antenna 314 to communicate in an analog or digital mode with Project 25 (P25) radios. The phrase “Project 25 (P25)”, as used herein, refers to a set of system standards produced by the Association of Public Safety Communications Officials International (APCO), the National Association of State Telecommunications Directors (NASTD), selected Federal Agencies and the National Communications System (NCS). The P25 set of system standards generally defines digital radio communication system architectures capable of serving the needs of Public Safety and Government organizations. Transceiver 300 is also generally configured to communicate in analog mode with non-P25 radios using RF transceiver 312.

Transceiver 300 may also include a local wireless interface 336 and related antenna 338 for transmitting and receiving audio signals and/or other information, such as digital data. In the embodiment of the present invention, the local wireless interface 336 may operate in accordance with a Bluetooth® wireless protocol. Bluetooth® is well adapted for use in the local wireless link 350 because it is extremely secure in that it employs several layers of data encryption and user authentication measures. Bluetooth® also provides a range of approximately 300 meters.

However, alternative technologies may be used for a local wireless connection. For example, transceiver 300 may communicate with another radio or communications device using short range wireless technologies such as the 802.xx family of wireless communications standards, including WiFi and ZigBee®. Alternatively, longer range wireless technologies such as WiMax, CDMA-1X, UMTS/HSDPA, GSM/GPRS, TDMA/EDGE, EV/DO may be used. Similar to above, the details of these technologies and the hardware required to implement transmitters and receivers that use these technologies are well known to persons skilled in the art, and thus, will not be described in great detail herein.

Microphone 342 comprises a pickup device enabled to convert an airborne wave of sound pressure into a electrical signal. A dynamic frequency range of the microphone 342 may extend to a frequency range associated with a human voice, or, alternately, extend over the entire human audible range. Microphone 342 can be physically integrated into the enclosure of the transceiver 300. Microphone 342 can be a directional microphone, optimized to receive a sound in a particular set of directions relative to a surface of microphone 342. This directionality may be based on the manner in which microphone 342 is constructed and/or a manner in which microphone 342 is integrated into the enclosure of transceiver 300.

Loudspeaker 344 comprises a transducer enabled to convert an electrical audio signal into sound pressure waves. In a preferred embodiment of the present invention, this transducer may include a cone that is mechanically activated by the interaction of a loudspeaker coil 345 and a permanent magnet. Particularly, the cone is arranged to vibrate when an electrical waveform is applied to the coil 345, creating a magnetic field that reacts with the permanent magnet. In turn, this reaction causes the cone to vibrate in a manner that produces the sound pressure waves. Within the loudspeaker 344, a minimal air gap exists between the coil 345 and the permanent magnet in order to enable the loudspeaker to be driven by the electrical waveform at the maximum possible efficiency.

Loudspeaker 344 may be dimensioned appropriately to maximize a surface area of the cone within a limited amount space of the enclosure of transceiver 300. Similar to the microphone 342, the output frequency of the loudspeaker 344 may have a high dynamic range, extending throughout the entire human audible frequency range. In an alternate embodiment, the frequency range of the loudspeaker 344 may generally extend to a range of audio frequencies associated with a human voice.

The loudspeaker 344 can have a broad output sound field, permitting a reproduced sound to be audibly detected in a wide range of positions relative to the surface of the cone. In an alternate embodiment, the loudspeaker 344 can have a narrow sound field wherein the reproduced sound may be heard in a limited number of degrees relative to a surface of the cone. In alternate embodiments, loudspeaker 344 can also be a piezoelectric loudspeaker or other type of transducer. In these cases the driving element may not be a coil but some other device for converting electrical to acoustic energy, wherein the same basic principals apply due to the natural physical effects of heat dissipation in these conversion processes.

Characteristics of loudspeaker 344 further include a maximum power capacity rating. This rating corresponds to the maximum power which can be dissipated before overheating of the loudspeaker will cause damage to the coil 345, such as by either melting the insulation of the coil or fusing the coil. A value of this rating may be provided in watts. When a temperature source, such as an input audio signal, is applied to the loudspeaker 344, a temperature of the coil 345 of the loudspeaker changes in a manner that is substantially repeatable. The temperature change can be defined by a thermal time constant.

Temperature sensor 346 includes a transducer that enables a temperature to be represented by an electrical signal. Temperature sensor 346 may include a thermistor, thermocoupling, resistance temperature detector, or other types of thermal detectors. According to a preferred embodiment, the temperature sensor 346 can be an integrated circuit that provides an output voltage that is linearly related to a measured temperature. In the preferred embodiment, temperature sensor 346 is integrated into a position on the enclosure of transceiver 300 that is a predetermined distance from the loudspeaker and other heat-generating elements of transceiver 300. This predetermined distance is advantageously selected to enable temperature sensor 346 to accurately detect of an ambient temperature in which transceiver 300 is being operated. In alternate embodiments, the temperature sensor 346 may be positioned in close proximity to loudspeaker 344, enabling measurement of a temperature based on both a temperature of the loudspeaker, as well as an ambient temperature of an environment in which transceiver 300 is being used. In the preferred embodiment, temperature sensor 346 has a slow response, enabling a temperature value provided thereby to be relatively impervious to brief noise transients. As shown in FIG. 3, the temperature sensor 346 may be coupled to processor 310 in order to directly communicate a temperature signal to the processor 310 that represents a value of the measured ambient temperature.

Amplifier 340 is coupled between processor 310 and components such as microphone 342 and/or loudspeaker 344. The amplifier is configured to adjust levels of a received electrical signal, such as a gain controlled audio signal, being applied to loudspeaker 344. This adjustment is based on a minimum signal level required by the loudspeaker 344. Similarly, the amplifier 340 can be configured to adjust the levels of a signal received from microphone 342 in order to permit interoperation between different electrical signal ranges respectively associated with processor 310 and loudspeaker 344. Though not shown, amplifier 340 may also be connected between temperature sensor 346 and processor 310 to also provide similar signal level adjustments.

Power and channel control 350 may comprise one or more buttons or other physical input devices to turn transceiver 300 on and off and select a transmission and/or reception frequency, such as a frequency employed by RF receiver/transmitter 312. Moreover, control 350 may include a dial or other manual component for indicating a user selected volume control setting, representing a desired sound pressure level at which an user desires an audible output of radio 300 to be reproduced.

Display 352 may be one or more of a liquid crystal display (LCD), gas plasma, light emitting diode (LED), or any other type of display used with a radio. Display 352 may also include a touch sensitive screen arranged to receive input from an object such as a stylus or a digit from a human hand. Display is operative to show a variety of status information concerning the operation of transceiver 300, as well as a menu for showing different, selectable parameters of the transceiver 300.

Keypad 354 can comprise any input device arranged to receive input from a user. For example, keypad 354 may include a push button, numeric dial, or a keyboard. Keypad 356 may also include command buttons that are associated with navigating and selecting items in a menu shown on display 352.

Push-to-talk (PTT) input 356 comprises a button or other physical actuator. Use of the PTT input 358 represents that an user would like to speak or provide other audible input to radio 300. Actuation of PTT 358 enables audio signal detected at microphone 342 to be amplified by amplifier 340, further processed by processor 310, and sent to another radio device through either of transceivers 312, 336.

Transceiver 300 can also comprise an accessory interface (I/F) 358 for communicating with one or more accessories that enable additional, alternate, or improved functionality in comparison with the components integrated in transceiver 300. Such accessories may include an external microphone, a headset, loudspeaker-microphone, voice operated control, or other input or output devices not shown in FIG. 3. Accessory I/F 358 may also be connected to processor 310 through amplifier 340 (not shown).

Power supply 360 provides power to transceiver 300. Particularly, as shown in FIG. 3, power supply 360 may directly provide power to processor 310 and RF receiver 312. A rechargeable or non-rechargeable battery may be used to provide power. The power may also be provided by an external power source, such as an AC adapter, a vehicle battery, or a powered docking cradle that supplements and/or recharges a battery.

GPS receiver 370 can process GPS signals received through GPS antenna 372 and, based on these signals, determine the physical coordinates of transceiver 300 on the surface of the Earth, which typically outputs a location as latitude and longitude values. GPS receiver 370 can also employ other geo-positioning mechanisms, including, but not limited to, triangulation, assisted GPS (AGPS), E-OTD, CI, SAI, ETA, BSS or the like, to further determine the physical location of transceiver 300 on the surface of the earth.

Memory 320 can include RAM, a ROM, and other storage means. Memory 320 illustrates an example of processor readable storage media for storage of information such as processor readable instructions, data structures, program modules, or other data.

At least one application stored in memory 320 may include a gain control 322 capable of executing on processor 310. When executed, gain control 322 protects an output transducer in a manner described above in relation to FIGS. 1 and 2. For example, gain control 322 can be configured to selectively modify a gain factor applied to an gain controlled audio signal that is subsequently communicated to loudspeaker 344 in radio 300.

As explained above, the gain control 322 estimates a heating effect of an input audio signal on at least one loudspeaker. The input audio signal may be derived from an RF signal detected by RF transceiver 312. The estimated heating effect comprises a predicted temperature associated with the loudspeaker. For example, the estimated heating effect can comprise a predicted temperature of a coil of the at least one loudspeaker, such as coil 345 of loudspeaker 344. As explained in reference to FIGS. 1 and 2, the gain control 322 advantageously uses at least one thermal time constant modeled on the at least one loudspeaker to estimate the heating effect.

The gain control 322 selectively modifies a level of the input audio signal applied to the at least one loudspeaker based on the estimated heating effect. For example, the gain control 322 selectively modifies an amount of attenuation applied to a gain factor. The selectively attenuated gain factor can then be applied to the input audio signal to produce an output audio signal. The output audio signal can then be provided for the at least one loudspeaker, such as loudspeaker 344, through amplifier 340.

The processor 310 may also receive a temperature signal from a sensor, such as a temperature sensor 346. Using this temperature signal, gain control 322 executing on processor 310 may adjust the estimated heating effect as described in FIGS. 1 and 2. In particular, the temperature signal is used to determine a base operating temperature associated with the loudspeaker.

The gain control 322 shown in FIG. 3 is a software application capable of implementing a gain control system similar to gain control system 100. It includes processor executable instructions which, when executed by processor 310, provide for controlling an output sound pressure level of a loudspeaker as previously described in relation to FIGS. 1 and 2. However, gain control 322 may be implemented in other manners as well. For example, gain control 322 may be implemented as a digital signal processor, configured to execute instructions that have been downloaded and stored on a processor readable storage medium such as memory 320. The gain control system may also be implemented as processor readable instructions executed by a field-programmable gate array. Moreover, all or part of gain control 322 may be implemented by an analog circuit.

All of the apparatus, methods and algorithms disclosed and claimed herein can be made and executed without undue experimentation in light of the present disclosure. While the invention has been described in terms of preferred embodiments, it will be apparent to those of ordinary skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to one of ordinary skill in the art are deemed to be within the spirit, scope and concept of the invention as defined.

What is claimed is:

1. A loudspeaker system, comprising:

a loudspeaker including a loudspeaker coil;

a temperature sensor positioned in close proximity to said loudspeaker and configured to generate a temperature signal which is based on both a temperature of the loudspeaker and on an ambient temperature of an environment in which said loudspeaker is disposed;

a temperature component including a thermal modeling element arranged to determine an estimated relative temperature associated with the loudspeaker coil based on an input audio signal and a predetermined thermal response characteristic associated with the loudspeaker;

a summer coupled to an output of the thermal modeling element and configured to sum an output from the thermal modeling element with a measured temperature value derived from said temperature signal to determine an absolute temperature of said loudspeaker coil;

a control component arranged to provide a gain factor based on the absolute temperature; and a gain component arranged to provide a gain controlled audio signal for said loudspeaker by selectively controlling a gain applied to the input audio signal based on the gain factor.

2. The loudspeaker system of claim 1, further comprising:

an amplifier coupled to the gain component, arranged to receive the gain controlled audio signal, and further arranged to drive the loudspeaker; and a microphone configured to monitor an output of said loudspeaker and generate a detected audio signal;

wherein said temperature component is further arranged to determine said estimated temperature based on said detected audio signal.

3. The loudspeaker system of claim 2, wherein said temperature component is configured to compute an average of said input audio signal and said detected audio signal, and to determine said estimated temperature based on said average.

4. The loudspeaker system of claim 1, further comprising a chassis enclosing said loudspeaker, wherein the temperature sensor is configured to measure said ambient temperature inside of said chassis.

5. The loudspeaker system of claim 1, wherein the predetermined thermal response characteristic comprises a thermal time constant modeled on the loudspeaker.

6. The loudspeaker system of claim 1, wherein the loudspeaker system is part of a radio communications device.

7. A gain control system, comprising:

an audio input circuit configured to receive an input audio signal;

a temperature sensor positioned in close proximity to a loudspeaker and configured to generate a temperature signal which is based on both a temperature of the loudspeaker and on an ambient temperature of an environment in which said loudspeaker is disposed; and a processor coupled to said audio input circuit and arranged to predict a relative temperature of a loudspeaker coil based on a heating effect of the input audio signal on the loudspeaker coil;

wherein said processor includes a summer configured to sum a relative temperature determined by the processor with a measured temperature value derived from the temperature signal to predict an absolute temperature of the loudspeaker coil;

wherein said processor is configured to selectively modify a gain control signal based on the absolute temperature of the loudspeaker coil which has been predicted.

8. The apparatus of claim 7, wherein said processor uses at least one thermal time constant modeled on the loudspeaker to predict the heating effect of the audio signal upon the loudspeaker.

9. The apparatus of claim 7, wherein said gain control signal is coupled to a gain device responsive to said gain control signal, said processor configured for causing said gain control signal to reduce a gain applied to said input audio signal by said gain device when said absolute temperature which has been predicted exceeds a threshold value.

10. The apparatus of claim 7, wherein the processor comprises a digital signal processor, configured to execute instructions stored on a processor readable storage medium.

11. A method for maximizing a sound pressure level, comprising:

receiving a temperature signal from a sensor positioned in close proximity to a loudspeaker, said temperature signal based on both a temperature of the loudspeaker and a temperature of an environment in which a loudspeaker is disposed;

deriving an estimated relative temperature associated with a loudspeaker coil of said loudspeaker based on an input audio signal and at least one parameter associated with the loudspeaker;

summing the estimated relative temperature of the loudspeaker coil with a measured temperature value derived from the temperature signal to predict an absolute temperature of the loudspeaker coil;

generating a gain factor based on the absolute temperature;

producing a gain-controlled audio signal by applying the gain factor to the input audio signal; and driving the loudspeaker with the gain-controlled audio signal.

12. The method of claim 11, wherein generating the gain factor further includes:

comparing the absolute temperature with a protection threshold temperature; and attenuating the gain factor if the absolute temperature exceeds the protection threshold temperature.

13. The method of claim 11, wherein the absolute temperature is for a loudspeaker coil.

14. The method of claim 11, wherein the at least one parameter is a thermal time constant modeled on the loudspeaker.

15. A loudspeaker system, comprising:

a loudspeaker including a loudspeaker coil;

a microphone configured to monitor an output of said loudspeaker and generate a detected audio signal;

a temperature sensor positioned in close proximity to said loudspeaker and configured to generate a temperature signal which is based on both a temperature of the loudspeaker and on an ambient temperature of an environment in which said loudspeaker is disposed;

a stress component including a thermal modeling element arranged to determine a relative stress value which represents an estimate of the relative stress imposed on the loudspeaker coil by an input audio signal, based on said input audio signal and said detected audio signal;

a summer coupled to an output of the thermal modeling element and configured to sum the relative stress value from the thermal modeling element with a measured thermal value derived from the temperature signal to determine an absolute stress value predicted for the loudspeaker coil;

a control component arranged to provide a gain value based on the absolute stress value; and a gain component arranged to provide a gain controlled audio signal for said loudspeaker by selectively controlling a gain applied to an input signal of said loudspeaker based on the gain value.

16. The loudspeaker system of claim 15, wherein the stress component is configured to determine said relative stress value using a time constant associated with said loudspeaker.

17. The loudspeaker system of claim 15, wherein the stress component is configured to determine said relative stress value by modeling the thermal response of the loudspeaker.

18. The loudspeaker system of claim 15, wherein said stress component is configured to estimate a cumulative mechanical stress resulting from vibration on the loudspeaker over a predetermined period of time.

19. The loudspeaker system of claim 15, wherein said stress component is configured to compute an average of said audio signal and said detected audio signal, and to determine said relative stress value based on said average.

20. The loudspeaker system of claim 15, further comprising an amplifier coupled to the gain component, arranged to receive the gain controlled audio signal, and further arranged to drive the loudspeaker.

21. The loudspeaker system of claim 15, wherein the stress component is further arranged to determine the stress value based on maximum-rated environmental and electrical specifications of the loudspeaker system.

22. The loudspeaker system of claim 15, wherein the loudspeaker system is part of a radio communications device.

23. A gain control system, comprising:

a circuit configured to receive an input audio signal;

a microphone configured to monitor an output of a loudspeaker, and to generate a detected audio signal;

a temperature sensor positioned in close proximity to said loudspeaker and configured to generate a temperature signal which is based on both a temperature of the loudspeaker and on an ambient temperature of an environment in which said loudspeaker is disposed;

a processor coupled to said circuit and arranged to predict a relative stress effect of the input audio signal on a loudspeaker coil of said loudspeaker, based on said input audio signal and said detected audio signal;

wherein said processor includes a summer configured to sum a relative stress effect value determined by the processor with a measured temperature value derived from the temperature signal to predict an absolute stress value representing an absolute stress upon the loudspeaker coil;

wherein said processor is configured to selectively modify a gain control signal based on the absolute stress value for controlling a gain applied to said input audio signal.

24. The apparatus of claim 23, wherein said processor uses at least one time constant modeled on the loudspeaker to predict the absolute stress effect of the audio signal upon the loudspeaker.

25. The apparatus of claim 23, wherein said gain control signal is coupled to a gain device responsive to said gain control signal, said processor configured for causing said gain control signal to reduce a gain applied to said input audio signal by said gain device when said absolute stress which has been predicted exceeds a threshold value.

26. The apparatus of claim 23, wherein the processor comprises a digital signal processor configured to execute instructions stored on a processor readable storage medium.

27. A method for maximizing a sound pressure level, comprising:

receiving a detected audio signal indicative of an output of a loudspeaker;

receiving a temperature signal from a sensor positioned in close proximity to a loudspeaker, said temperature signal based on both a temperature of the loudspeaker and a temperature of an environment in which a loudspeaker is disposed;

deriving a relative stress value associated with a loudspeaker coil of said loudspeaker based on an input audio signal, said detected audio signal, and at least one parameter associated with the loudspeaker;

summing the relative stress value with a measured temperature value derived from the temperature signal to predict an absolute stress value which represents the absolute stress on the loudspeaker coil;

generating a gain factor based on the absolute stress value;

producing a gain-controlled audio signal by applying the gain factor to the input audio signal; and driving the loudspeaker with the gain-controlled audio signal.

28. The method of claim 27, wherein generating the gain factor further includes:

comparing the absolute stress value with a protection threshold stress level; and attenuating the gain factor if the absolute stress value exceeds the protection threshold stress level.

29. The method of claim 27, wherein the parameter is a thermal time constant modeled on the loudspeaker.

* * * * *